(12) United States Patent
Morriss

(10) Patent No.: US 7,315,599 B1
(45) Date of Patent: Jan. 1, 2008

(54) SKEW CORRECTION CIRCUIT

(75) Inventor: Jeff C. Morriss, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,359

(22) Filed: Dec. 29, 1999

(51) Int. Cl.
*H04L 25/00* (2006.01)

(52) U.S. Cl. .................................................. 375/371

(53) Field of Classification Search ............... 375/371, 375/373, 375, 376; 714/700
See application file for complete search history.

(56) References Cited

U.S. PATENT DOCUMENTS

| | | | | |
|---|---|---|---|---|
| 3,872,397 A | * | 3/1975 | Hanneman | 331/1 A |
| 5,184,350 A | * | 2/1993 | Dara | 370/466 |
| 5,465,277 A | * | 11/1995 | Schreurs et al. | 375/375 |
| 5,638,410 A | * | 6/1997 | Kuddes | 375/357 |
| 5,736,872 A | * | 4/1998 | Sharma et al. | 327/3 |
| 5,854,553 A | * | 12/1998 | Barclay et al. | 324/207.16 |
| 5,973,526 A | * | 10/1999 | Dabral | 327/170 |
| 6,008,703 A | * | 12/1999 | Perrott et al. | 332/100 |
| 6,119,242 A | * | 9/2000 | Harrison | 713/503 |
| 6,247,138 B1 | * | 6/2001 | Tamura et al. | 713/400 |
| 6,269,060 B1 | * | 7/2001 | Harvey et al. | 369/47.28 |
| 6,292,040 B1 | * | 9/2001 | Iwamoto et al. | 327/158 |
| 6,338,144 B2 | * | 1/2002 | Doblar et al. | 713/400 |
| 6,608,703 B1 | * | 8/2003 | Toriyama et al. | 358/410 |
| 6,775,344 B1 | * | 8/2004 | Buhler et al. | 375/376 |
| 2001/0013802 A1 | * | 8/2001 | Faulcon et al. | 327/244 |

* cited by examiner

*Primary Examiner*—Kevin Kim
(74) *Attorney, Agent, or Firm*—Trop, Pruner & Hu, P.C.

(57) ABSTRACT

A skew correction circuit includes a first circuit and a second circuit. The first circuit generates at least one pulse train signal in response to a data bit signal and a first strobe signal. A duty cycle of the pulse train signal is indicative of a degree of skew between the data bit signal and the strobe signal. The second circuit is coupled to the first circuit to produce a second strobe signal and regulate a timing relationship between the data bit signal and the second strobe signal based on the duty cycle of the pulse train.

24 Claims, 4 Drawing Sheets

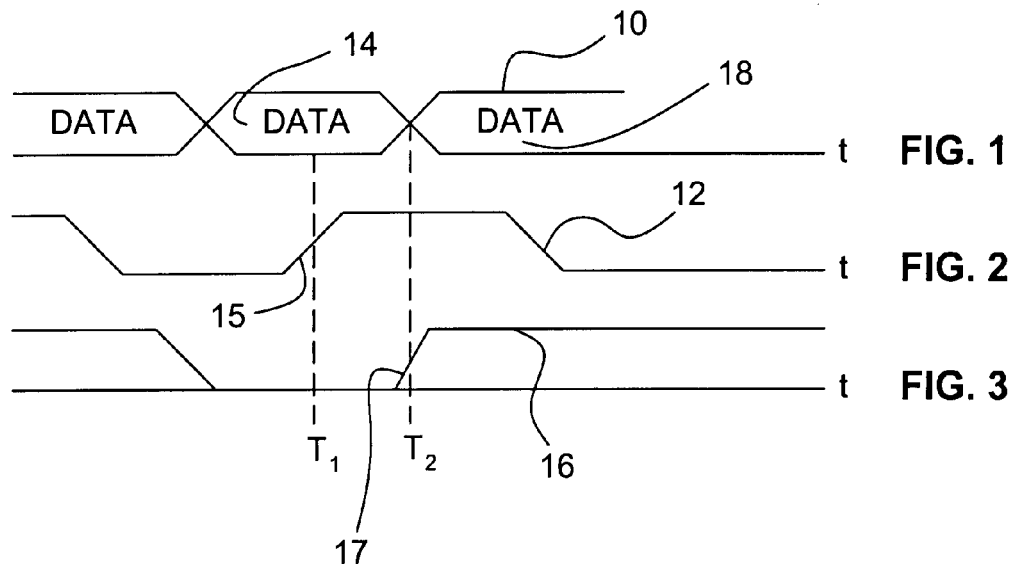
FIG. 1
FIG. 2
FIG. 3
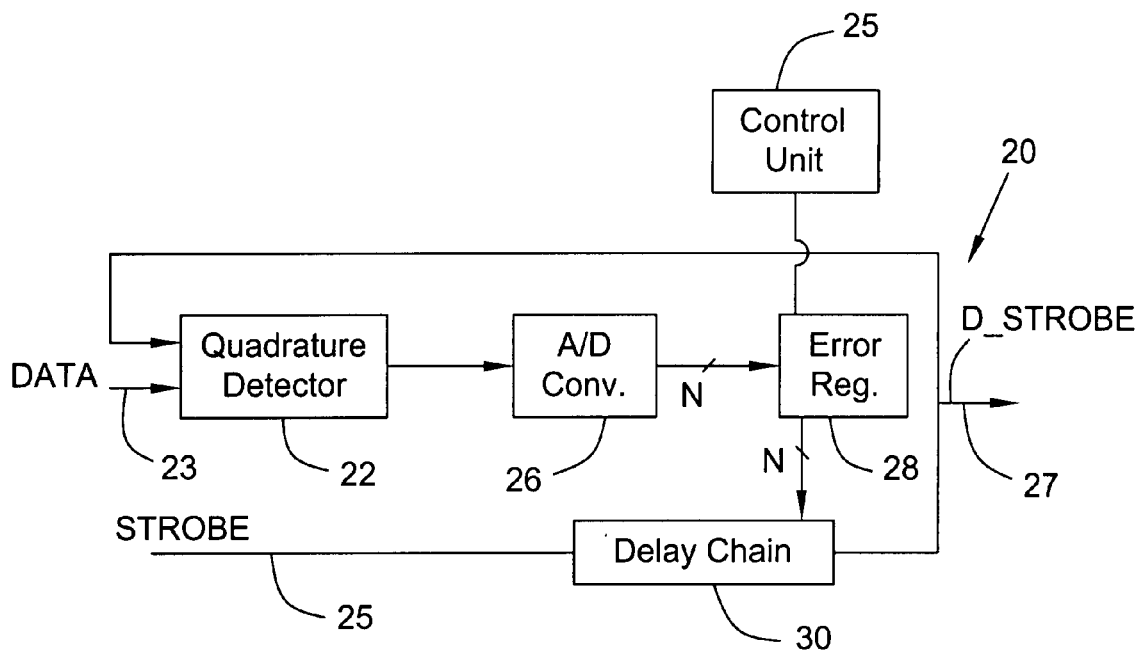
FIG. 4

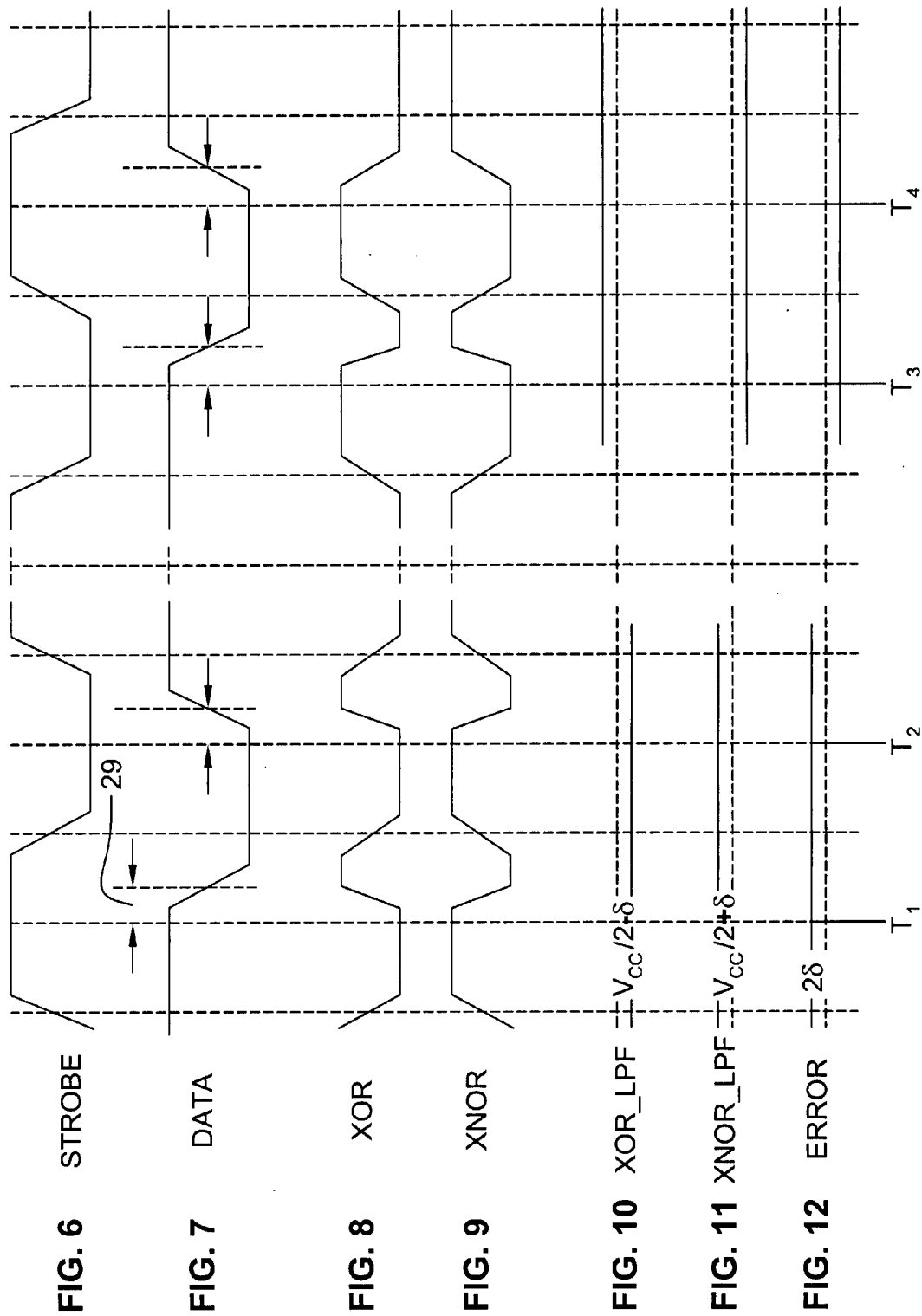

SKEW CORRECTION CIRCUIT

BACKGROUND

The invention generally relates to a skew correction circuit.

Computer devices typically use buses to communicate with each other. In this manner, the bus typically include data lines that propagate data signals for purposes of communicating data between the devices. For purposes of synchronizing the capture of the data by the receiving device, or receiver, the transmitting device, or transmitter, may furnish a strobe signal (to a strobe line of the bus) that accompanies the data signals in a technique called source synchronous signaling.

In this manner, in source synchronous signaling, the strobe signal and data signals are synchronized together at the transmitter, the source of the transmitted signals. The strobe signal includes edges to which the receiver responds to latch the data signals at the appropriate times. Because the strobe signal propagates approximately along the same signal path as the data signals, the strobe signal experiences approximately the same delay as the data signals. However, the signal paths are not identical, and thus, a delay, or skew, may exist at the receiver between each data signal and the strobe signal. Therefore, typically the receiver includes circuitry, such as fixed delay lines, to adjust the timing of the strobe and/or data signals to accommodate any relative delay, or skew, between the strobe signal and the data signals.

There are two approaches that are commonly used to implement source synchronous signaling: quadrature strobing and coincident strobing. Quadrature strobing centers each data eye, or cell, of a data signal 10 (see FIG. 1) with edges of a data strobe signal 12 (see FIG. 2). For example, a particular data cell 14 of the data signal 10 may be aligned with a particular edge 15 of the data strobe signal 12 at time $T_1$. With quadrature strobing, the misalignment of the strobe signal with the data signal is a function of the skew that is introduced by the transmitter, the interconnect bus lines and the receiver. Therefore, this skew may cause the edges of the data strobe signal to fall well outside of the center of the data eyes of the data signal.

With coincident strobing, the transmitter aligns the edges of the data signal and a strobe signal so that the signals are driven simultaneously onto the bus. For example, a particular edge 17 (see FIG. 3) of a data strobe signal 16 may be used to cause the receiver to capture a bit of data that is indicated by an eye 18 of the data signal 10. Due to the coincident strobing, at the transmitter, the eye 18 begins appearing on the bus at the same time (time $T_2$) at which the edge 17 appears. The receiver typically delays the data strobe signal 16 via a fixed delay line to center the edge 17 in the eye 18.

Because a different skew may exist between each data signal and the strobe signal, the above-described techniques may not eliminate all of the skews between the data signals and the strobe signal. Furthermore, the skew may not be fixed, but rather, the skew may vary over time due to temperature and/or voltage variations.

Thus, there is a continuing need for an arrangement that addresses one or more of the problems that are stated above.

SUMMARY

In one embodiment of the invention, a method includes using a data bit signal and a first strobe signal to generate a pulse train signal. A duty cycle of the pulse train signal indicates a degree of skew between the data bit signal and the strobe signal. A timing relationship is regulated between the data bit and the second strobe signal based on the degree of skew that is indicated by the duty cycle.

Advantages and other features of the invention will become apparent from the following description, drawing and claims.

BRIEF DESCRIPTION OF THE DRAWING

FIG. 1 depicts a portion of a data bit signal.

FIGS. 2 and 3 depict strobe signals for different source synchronous strobing techniques of the prior art.

FIG. 4 is a schematic diagram of a skew correction circuit according to an embodiment of the invention.

FIG. 6 is a waveform illustrating a strobe signal according to an embodiment of the invention.

FIG. 7 is a waveform illustrating a data bit signal according to an embodiment of the invention.

FIGS. 8, 9, 10, 11 and 12 are signals of the quadrature detector according to an embodiment of the invention.

DETAILED DESCRIPTION

Figure 5:
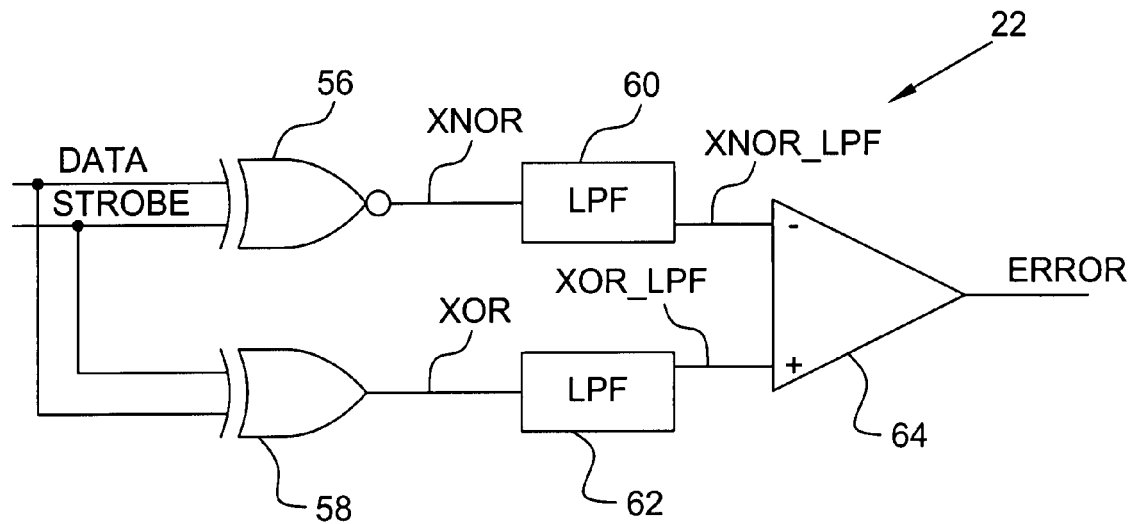
FIG. 5 is a schematic diagram of a quadrature detector of the skew correction circuit of FIG. 4 according to an embodiment of the invention.

Referring to FIG. 4, an embodiment 20 of a skew correction circuit in accordance with the invention measures the amount of delay, or skew, between a data strobe signal and a data signal and delays the strobe signal by approximately the measured amount of skew to minimize the skew between these signals. Due to this arrangement, the skew correction circuit 20 may continually adjust the timing relationship between the data signals and the strobe signal to compensate for skew variation over time that may be attributed to voltage and/or temperature variations. In some embodiments, the skew correction circuit 20 delays the data strobe signal to maintain a quadrature strobing relationship between the data and data strobe signals.

More particularly, in some embodiments, the skew correction circuit 20 receives a data signal (called DATA (see also FIG. 7)) and a data strobe signal (called STROBE (see also FIG. 6)) from lines of a bus. Ideally, the DATA and STROBE signals are aligned in quadrature so that the edges of the STROBE signal are centered in the corresponding data eyes of the DATA signal. However, a delay, or skew 29 (see FIG. 7), may exist between the DATA and STROBE signals, a skew that may cause incorrect data to be captured from the bus. To compensate for this condition, in some embodiments, the skew correction circuit 20 includes logic to combine the data and data strobe signals to produce at least one pulse train signal. As further described below, this pulse train signal has a duty cycle that indicates the degree, or amount, of the skew 29. In this manner, the circuit 20 delays the STROBE signal based on the indication of degree of skew from the duty cycle to produce a delayed data strobe signal (called D_STROBE), a substantial duplicate of the STROBE signal but shifted in time to remove the skew 29.

To accomplish the skew compensation, in some embodiments, the skew correction circuit 20 includes a quadrature detector 22 (see FIG. 4) that measures the degree, or amount, to which the STROBE signal is not centered with respect to the DATA signal (i.e., the detector 22 measures the skew 29) and provides an error signal (called ERROR (see FIG. 12)) that indicates this measurement and thus, indicates the amount of calibration that is needed. In some embodiments, the ERROR signal is an analog signal that an analog-to-digital converter (ADC) 26 (of the skew correction circuit 20) converts into a digital signal. The skew correction circuit 20 may include an error register 28 that stores an indication called a calibration value, of the digital signal. The calibration value, in turn, is used to directly program the delay by which a programmable delay chain 30 delays the STROBE signal to produce the D_STROBE signal. Therefore, the degree to which the STROBE signal is not centered with respect to the DATA signal establishes the delay that is introduced by the delay chain 30.

Referring to FIG. 5, in some embodiments, the quadrature detector 22 includes logic to combine the DATA and STROBE signals to produce two pulse train signals, each of which has a duty cycle that indicates the degree of skew. In this manner, the quadrature detector may include an XNOR gate 56 that receives the DATA and STROBE signals at different input terminals and produces a signal (called XNOR (see FIG. 9)) whose duty cycle is indicative of the amount of the skew 29. The quadrature detector 22 may also include an XOR gate 58 that receives the DATA and STROBE signals at different input terminals and produces a signal (called XOR (see FIG. 8)) whose duty cycle is indicative of the degree of the skew 29. In general, the duty cycles of the XOR and XNOR signal vary inversely with respect to each other in response to the changes in the skew 29, as described below. The XNOR and XOR signals are received by two low pass filters (LPFs) 60 and 62, respectively, that produce signal that indicate the duty cycles of the received signals. In this manner, the LPF 60 produces a signal (called XNOR_LPF (see FIG. 10)) that indicates the duty cycle of the XNOR signal, and the LPF 62 produces a signal (called XOR_LPF (see FIG. 11)) that indicates the duty cycle of the XOR signal. A differential amplifier 64 (of the skew correction circuit 20) compares the XOR_LPF and XNOR_LPF signals to produce the ERROR signal.

The operation of the quadrature detector 30 is dependent on the transitions of the logical state of the DATA signal and the state of the STROBE signal. In particular, there are four possible combinations of transitions that affect the quadrature detector 30:

1. A logical one to a logical zero transition of the DATA signal when the STROBE signal has a logical one state, as depicted near time $T_1$ in FIGS. 6-12;

2. A logical zero to a logical one transition of the DATA signal when the STROBE signal has a logical one state, as depicted near time $T_2$ in FIGS. 6-12;

3. A logical one to a logical zero transition of the DATA signal when the STROBE signal has a logical zero state, as depicted near time $T_3$ in FIGS. 6-12; and 4. A logical zero to a logical one transition of the DATA signal when the STROBE signal has a logical one state, as depicted near time $T_4$ in FIGS. 6-12;

For transition numbers one and two, the duty cycle of the XOR signal and the level of the XOR_LPF signal decreases with an increase in the skew 29, and the duty cycle of the XNOR signal and the level of the XNOR_LPF signal increases with an increase in the skew 29. This relationship causes the ERROR signal to indicate a positive value that is proportional to the degree of skew, as depicted in FIG. 12.

For transition numbers three and four, the duty cycle of the XOR signal and the level of the XOR_LPF signal increases with an increase in the skew 29, and the duty cycle of the XNOR signal and the level of the XNOR_LPF signal decreases with an increase in the skew 29. This relationship causes the ERROR signal to indicate a negative value that is proportional to the degree of skew, as depicted in FIG. 12.

Therefore, using these relationships, in some embodiments, a calibration data pattern may be used to produce a net error offset (as indicated by the ERROR signal) whenever there is a nonzero quadrature error. In some embodiments, the calibration data pattern is chosen to implement either transitions one and two or transitions three and four, without mixing these groupings.

The LPFs 56 and 58 (see FIG. 5) of the quadrature detector 20 filter out frequency components (of the XOR and XNOR signals) that are a function of the data rate and the edge rate to produce the XOR_LPF and XNOR_LPF signals that are nearly DC. Any non-DC components of the XOR_LPF and XNOR_LPF signals are attributable to the variance of the skew with voltage and temperature. Typically, the component of the skew that varies in such a manner that this variation has a maximum bandwidth of 10 Hz or less. Besides producing newly DC signals, the LPFs 56 and 58 also provide bandlimiting for purposes of preventing the ADC 26 from receiving a signal that has a frequency greater than one half of the sampling frequency of the sample-and-hold circuit 24. As an example, the ADC 26 may be a delta-sigma ADC. Other ADCs may be used in other embodiments.

The calibration value is stored in the error register 28 each time the quadrature error is updated, and the rate at which the error register 28 is updated is a function of how rapidly the skew can change. If the skew exhibits little change over time then it may be sufficient to update the error register 28 only at power-up. Otherwise the error register 28 may be updated at a rate slightly faster than the skew can change. In some embodiments, a control unit 25 controls when updates to the error register 28 are made.

In some embodiments, the delay chain 30 may include inverters that are coupled together via multiplexers to form the desired delay. The delay chain 30 is designed for the appropriate dynamic range and resolution. In this manner, because in some embodiments, coincident strobing may be used at the source, the dynamic range accommodates the delay of one half of the bit time plus maximum amount of skew that needs to be corrected. The resolution specifies how fine a correction can be made. Typically the resolution should be on the order of the setup, or hold, time for the receive buffer. For example, for current silicon processes this is about 50 picoseconds (pS). However, this value may be reduced or increased according to the particular process.

As an example, a 500 megabits per second (Mb/s) system may have up to +/−500 pS of skew. The bit time for this system is 2.0 nanoseconds (nS), so that one half of a bit time would be 1.0 nS. For this example, the delay chain 30 may be designed to delay a nominal 1.0 nS (to center the strobe if there were no other skew) plus an additional delay of 500pS (to account for worst case skew). The normal operating range of the delay would then be 500 pS −1.5 nS.

Figure 13:
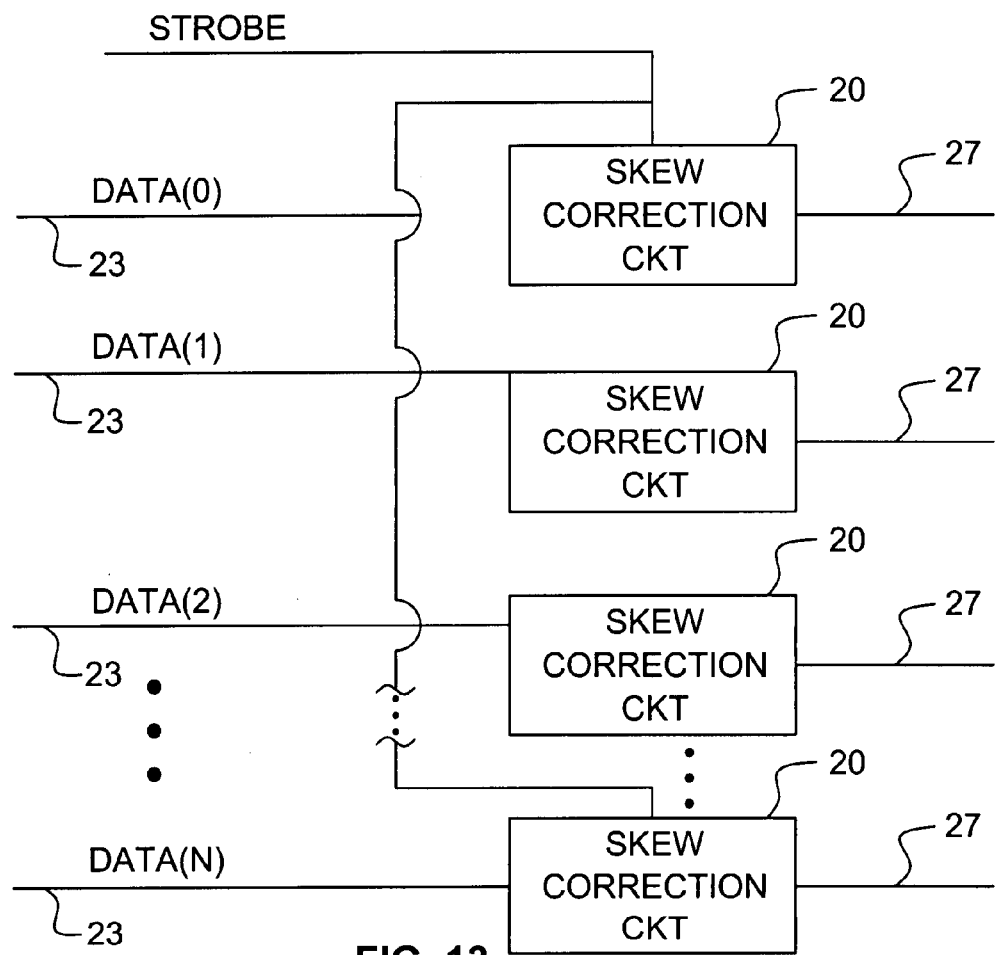
FIG. 13 is a schematic diagram of a system that uses multiple skew correction circuits according to an embodiment of the invention.

Referring to FIG. 13, in some embodiments, a skew correction circuit 20 may be associated with each data line 23 of the bus. In this manner, this arrangement accommodates different skews between each different data signal and the data strobe signal. Each skew correction circuit 20 is coupled between a different one of the data lines 23 and the associated data output line 27.

Figure 14:
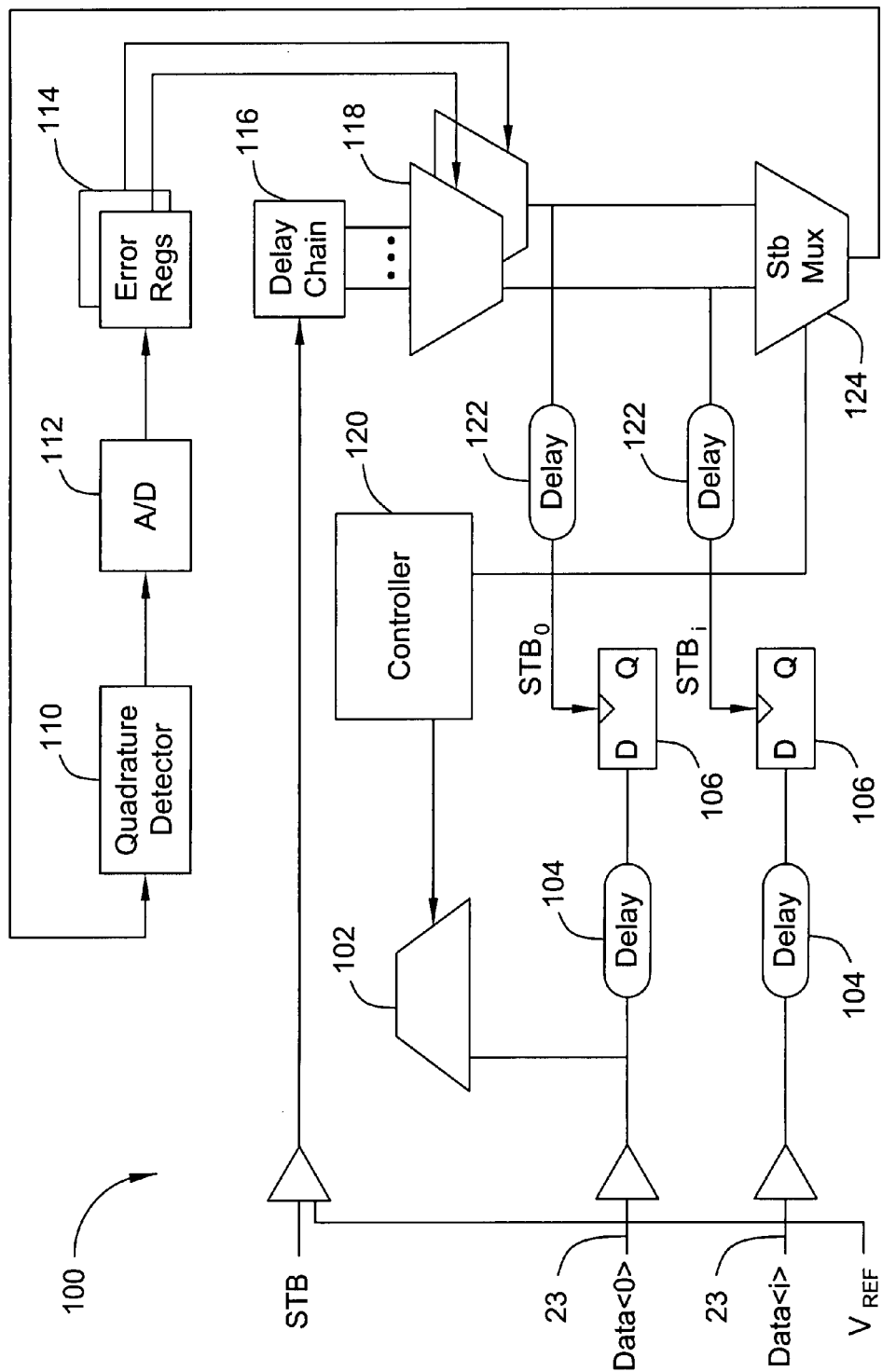
FIG. 14 is a schematic diagram of a data receiver according to an embodiment of the invention.

Other arrangements are within the scope of the following claims. For example, FIG. 14 depicts a receiver 100 that includes multiplexing features to minimize the number of skew correction circuits. In this manner, the skew correction circuit 100 provides multiple strobe signals (called $STB_0, \ldots STB_i$), each of which is associated with one of the data lines 23 and may be used to compensate a different skew. In this manner, the skew correction circuit includes a quadrature detector 110 and an ADC 112 that function similar the quadrature detector 22 and the ADC 26 of the skew correction circuit 20. The output terminals of the ADC 112 are coupled to error registers 114. Each error register 114, in turn, is associated with a different data line 23 and stores an indication of the delay to be used with the strobe signal that is associated with the data line 23. In this manner, the output terminals of each error register 114 are coupled to the select terminals of a different multiplexer 118, and the input terminals of each multiplexer 118 are coupled to taps of a delay chain 116 that receives a buffered strobe signal. The output terminal of each multiplexer 118 is coupled to the clock input of a different data bit receive buffer that may be formed from a D-type flip-flop, for example. Due to this arrangement, the indication that is stored in a particular error register 114 causes the associated multiplexer 118 to select the appropriate tap of the delay chain 116 and thus, select the appropriate strobe delay. Thus, the skew correction circuit 110 is capable of correcting the skew that is associated with each data line 23.

For purposes of storing the appropriate indications of the error registers 114, the skew correction circuit includes a multiplexer 124 that has input terminals that are coupled to the output terminals of the multiplexers 118, and the output terminal of the multiplexer 124 is coupled to an input terminal of the quadrature detector 110. The other input terminal of the quadrature multiplexer 110 is coupled to the output terminal of a multiplexer 102. The input terminals of the multiplexer 110, in turn, are coupled to the data lines 23. A controller 120 of the skew correction circuit 100 is coupled to the selection terminals of the multiplexers 102 and 118 and to the error registers 114 so that the controller 120 may selectively measure the skews that are associated with each of the data lines 23 and cause an indication of the measured skew to be stored in the appropriate error register 114.

Among the other features of the skew correction circuit 100, the circuit 100 may include matched delay elements 102, each of which is coupled between a different one of the data lines 23 and the input terminal of a different one of the D-type flip-flops 106. The skew correction circuit 100 may also include matched delay elements 122, each of which is coupled between the clock input terminal of a different D-type flip-flop 106 and a different one of the output terminals of the multiplexer 118.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
    using a data bit signal and a first strobe signal to generate at least one pulse train signal, said at least one pulse train signal including a first pulse train signal having a duty cycle that increases with an increase in a degree of skew between the data bit signal and the first strobe signal and a second pulse train signal having a duty cycle that decreases with a decrease in the degree of skew;
    regulating a timing relationship between the data bit signal and the first strobe signal based on the degree of skew indicated by the duty cycles of the first and second pulse train signals;
    filtering the first pulse train signal to produce a first filtered signal;
    filtering the second pulse train signal to produce a second filtered signal; and
    amplifying a difference of the first and second filtered signals to indicate the degree of skew.

2. The method of claim 1, further comprising:
    storing a calibration value indicative of the degree of skew.

3. The method of claim 2, further comprising:
    delaying the first strobe signal based on the calibration value.

4. The method of claim 1, further comprising:
    causing the data bit signal to indicate a predetermined data pattern.

5. A data receiver comprising:
    buffers, each buffer to latch a different data bit signal;
    a first circuit to:
        for each data signal, generate at least one associated pulse train signal in response to a strobe signal and the data bit signal, a duty cycle of said at least one associated pulse train signal indicating a degree of skew between the associated data bit signal and the strobe signal;
    a second circuit coupled to the first circuit and the buffers to regulate latching of the data bit signals by the buffers based on the indicated degrees of skew; and
    multiplexing circuitry to select one of the data bit signals,
    wherein the first circuit comprises a third circuit to provide said at least one pulse train signal indicative of the degree of skew between the selected data bit signal and the strobe signal, and
    wherein said at least one pulse train signal comprises:
        a first pulse train signal having a duty cycle that increases with an increase in the degree of skew between the selected data bit signal and the strobe signal and a second pulse signal having a duty cycle that decreases with a decrease in the degree of skew between the selected data bit signal and the strobe signal.

6. The data receiver of claim 5, wherein the first circuit comprises:
    registers, each register being associated with a different one of the data bit signals and indicating the degree of skew between the strobe signal and the associated data bit signal.

7. The data receiver of claim 5, wherein the first circuit further comprises:
    a first low pass filter to filter the first pulse train signal to produce a first filtered signal;
    a second low pass filter to filter the second pulse train signal to produce a second filtered signal; and
    an amplifier to produce the indication of the degree of skew between the selected data bit signal and the strobe signal based on the difference of the first and second filtered signals.

8. A data receiver comprising:
    buffers, each buffer to latch a different data bit signal;
    a first circuit to:

for each data signal, generate at least one associated pulse train signal in response to a strobe signal and the data bit signal, a duty cycle of said at least one associated pulse train signal increasing with one of an increase and a decrease in a degree of skew between the associated data bit signal and the strobe signal and decreasing with the other of an increase and a decrease in the degree of skew; and a second circuit coupled to the first circuit and the buffers to regulate latching of the data bit signals by the buffers based on the indicated degrees of skew, wherein the first circuit comprises registers, each register being associated with a different one of the data bit signals and indicating the degree of skew between the strobe signal and the associated data bit signal.

9. A method comprising:

using a data bit signal and a first strobe signal to generate at least one pulse train signal, a duty cycle of said at least one pulse train signal increasing with one of an increase and a decrease in a degree of skew between the data bit signal and the first strobe signal and decreasing with the other of an increase and a decrease in the degree of skew;

regulating a timing relationship between the data bit signal and the first strobe signal based on the degree of skew indicated by the duty cycle; and delaying a second strobe signal based on a calibration value to produce the first strobe signal, wherein said at least one pulse train signal comprises a first pulse train signal having a duty cycle that increases with an increase in the degree of skew and a second pulse signal having a duty cycle that decreases with a decrease in the degree of skew.

10. The method of claim 9, further comprising:

filtering the first pulse train signal to produce a first filtered signal;

filtering the second pulse train signal to produce a second filtered signal; and amplifying a difference of the first and second filtered signals to indicate the degree of skew.

11. The method of claim 9, wherein the duty cycle of said at least one pulse train signal indicates the degree of skew.

12. The method of claim 9, further comprising:

causing the data bit signals to indicate a predetermined data pattern.

13. The method of claim 9, wherein said at least one pulse train signal indicates multiple non-zero degrees of skew.

14. The data receiver of claim 8, wherein the second circuit comprises:

a delay chain to receive the strobe signal, the delay chain including taps indicating the strobe signal delayed by different delays; and multiplexing circuitry to selectively couple the taps to the buffers based on the indicated degrees of skew.

15. The data receiver of claim 8, further comprising:

multiplexing circuitry to select one of the data bit signals, and wherein the first circuit comprises a third circuit to, for each of the data signals, provide said at least one pulse train signal indicative of the degree of skew between the selected data bit signal and the strobe signal.

16. The data receiver of claim 15, wherein said at least one pulse train signal comprises:

a first pulse train signal having a duty cycle that increases with an increase in the degree of skew between the selected data bit signal and the strobe signal and a second pulse signal having a duty cycle that decreases with a decrease in the degree of skew between the selected data bit signal and the strobe signal.

17. The data receiver of claim 16, wherein the first circuit further comprises:

a first low pass filter to filter the first pulse train signal to produce a first filtered signal;

a second low pass filter to filter the second pulse train signal to produce a second filtered signal; and an amplifier to produce the indication of the degree of skew between the selected data bit signal and the strobe signal based on the difference of the first and second filtered signals.

18. The data receiver of claim 8, wherein said at least one associated pulse train signal indicates multiple non-zero degrees of skew.

19. A method comprising:

using a data bit signal and a first strobe signal to generate at least one pulse train signal, a duty cycle of said at least one pulse train signal increasing with one of an increase and a decrease in a degree of skew between the data bit signal and the first strobe signal and decreasing with the other of an increase and a decrease in the degree of skew, and said at least one pulse train signal comprises a first pulse train signal having a duty cycle that increases with an increase in the degree of skew and a second pulse signal having a duty cycle that decreases with a decrease in the degree of skew;

regulating a timing relationship between the data bit signal and the first strobe signal based on the degree of skew indicated by the duty cycle;

storing a calibration value indicative of the degree of skew;

filtering the first pulse train signal to produce a first filtered signal;

filtering the second pulse train signal to produce a second filtered signal; and amplifying a difference of the first and second filtered signals to indicate the degree of skew.

20. The method of claim 19, further comprising:

delaying a second strobe signal based on the calibration value to produce the first strobe signal.

21. A skew correction circuit comprising:

a quadrature detector to generate at least one pulse train signal in response to a data bit signal and a first strobe signal, a duty cycle of said at least one pulse train signal increasing with one of an increase and a decrease in a degree of skew between the data bit signal and the first strobe signal and decreasing with the other of an increase and a decrease in the degree of skew;

a memory to store an indication of the degree of skew; and a regulator to regulate a timing relationship between the data bit signal and the first strobe signal based on the indication of the degree of skew stored in the memory.

22. The skew correction circuit of claim 21, wherein the regulator comprises:

a delay chain to delay a second strobe signal based on the indication of the degree of skew stored in the memory.

23. The skew correction circuit of claim 21, wherein said at least one pulse train signal comprises:

a first pulse train signal having a duty cycle that increases with an increase in the degree of skew and a second pulse signal having a duty cycle that decreases with a decrease in the degree of skew.

24. The skew correction circuit of claim 21, wherein said at least one pulse train signal comprises a first pulse train signal and a second pulse train signal and the detector comprises:

a first filter to filter the first pulse train signal to produce a first filtered signal;

a second filter to filter the second pulse train signal to produce a second filtered signal; and an amplifier to amplify a difference of the first and second filter signals to indicate the degree of skew.

* * * * *